US008022369B2

(12) United States Patent
Orava et al.

(10) Patent No.: US 8,022,369 B2
(45) Date of Patent: Sep. 20, 2011

(54) ULTRA THIN NEUTRON DETECTOR, METHOD FOR MANUFACTURING THE NEUTRON DETECTOR AND NEUTRON IMAGING APPARATUS

(75) Inventors: Risto Orava, Helsinki (FI); Tom Schulman, Porvoo (FI)

(73) Assignee: FinPhys Oy, Helsinki (FI)

( * ) Notice: Subject to any disclaimer, the term of this patent is extended or adjusted under 35 U.S.C. 154(b) by 0 days.

(21) Appl. No.: 12/719,284

(22) Filed: Mar. 8, 2010

(65) Prior Publication Data
US 2011/0095193 A1    Apr. 28, 2011

Related U.S. Application Data

(60) Provisional application No. 61/254,828, filed on Oct. 26, 2009.

(51) Int. Cl.
*G01T 3/08* (2006.01)
(52) U.S. Cl. .................................. 250/370.05
(58) Field of Classification Search ............ 250/370.01, 250/370.02, 370.05, 370.06, 390.01
See application file for complete search history.

(56) References Cited

U.S. PATENT DOCUMENTS

| 5,294,789 | A | * | 3/1994 | Kruger | 250/214.1 |
| 5,726,453 | A | * | 3/1998 | Lott et al. | 250/390.01 |
| 2005/0258372 | A1 | * | 11/2005 | McGregor et al. | 250/390.01 |
| 2009/0166550 | A1 | * | 7/2009 | Gazda et al. | 250/392 |
| 2010/0213380 | A1 | * | 8/2010 | Kub et al. | 250/370.05 |

FOREIGN PATENT DOCUMENTS
EP      1 531 344 A1    5/2005

OTHER PUBLICATIONS

United Kingdom Search Report—GB 10033663.0, dated Jul. 7, 2010.
Nicholas Licausi et al., "A novel solid-state self powered neutron detector", Proc. of SPIE vol. 7079 707908, (2008)-0277-786X/08, pp. 1-12.
Rebecca J. Nikolic et al., "Pillar Structured Thermal Neutron Detector", 2008 IEEE, 978-1-4244-2186-2/08.
Q. Shao et al., "Leakage Current Quenching and Lifetime Enhancement in 3D Pillar Structured Silicon PIN Diodes", 2009 IEEE, 978-1-4244-6031-1/09, ISDRS 2009, Dec. 9-11, 2009, College Park, MD, USA.
N. Deo et al., "Conformal filling of silicon micropillar platform with 10boron", 2008 American Vacuum Society, J. Vac. Sci, Technol. B 26(4), Jul./Aug. 2008, 1071-1023/2008/26(4)/1309/6, pp. 1309-1314.

* cited by examiner

*Primary Examiner* — David Porta
*Assistant Examiner* — Marcus H Taningco
(74) *Attorney, Agent, or Firm* — Young & Thompson

(57) ABSTRACT

A detector (100) for detecting neutrons includes a neutron reactive material (102) adapted to interact with neutrons to be detected and release ionizing radiation reaction products in relation to the interactions with neutrons. The detector also includes a first semiconductor element (101) being coupled with the neutron reactive material (102) and adapted to interact with the ionizing radiation reaction products and provide electrical charges proportional to the energy of the ionizing radiation reaction products. In addition electrodes are arranged in connection with the first semiconductor element (101) for providing charge collecting areas (106) for collecting the electrical charges and to provide electrically readable signal proportional to the collected electrical charges. The thickness of the first semiconductor element (101) is adapted to be electrically and/or physically so thin that it is essentially/practically transparent for incident photons, such as background gamma photons.

16 Claims, 6 Drawing Sheets
(3 of 6 Drawing Sheet(s) Filed in Color)

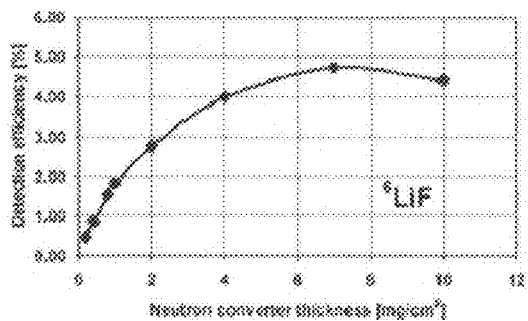
FIG. 3A
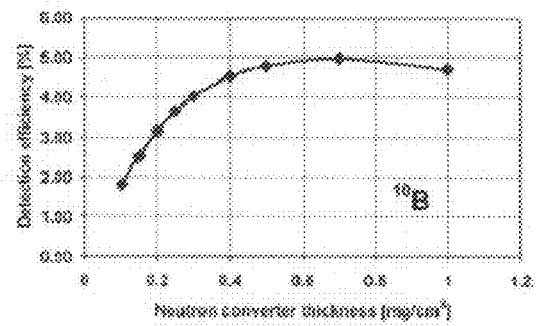
FIG. 3B
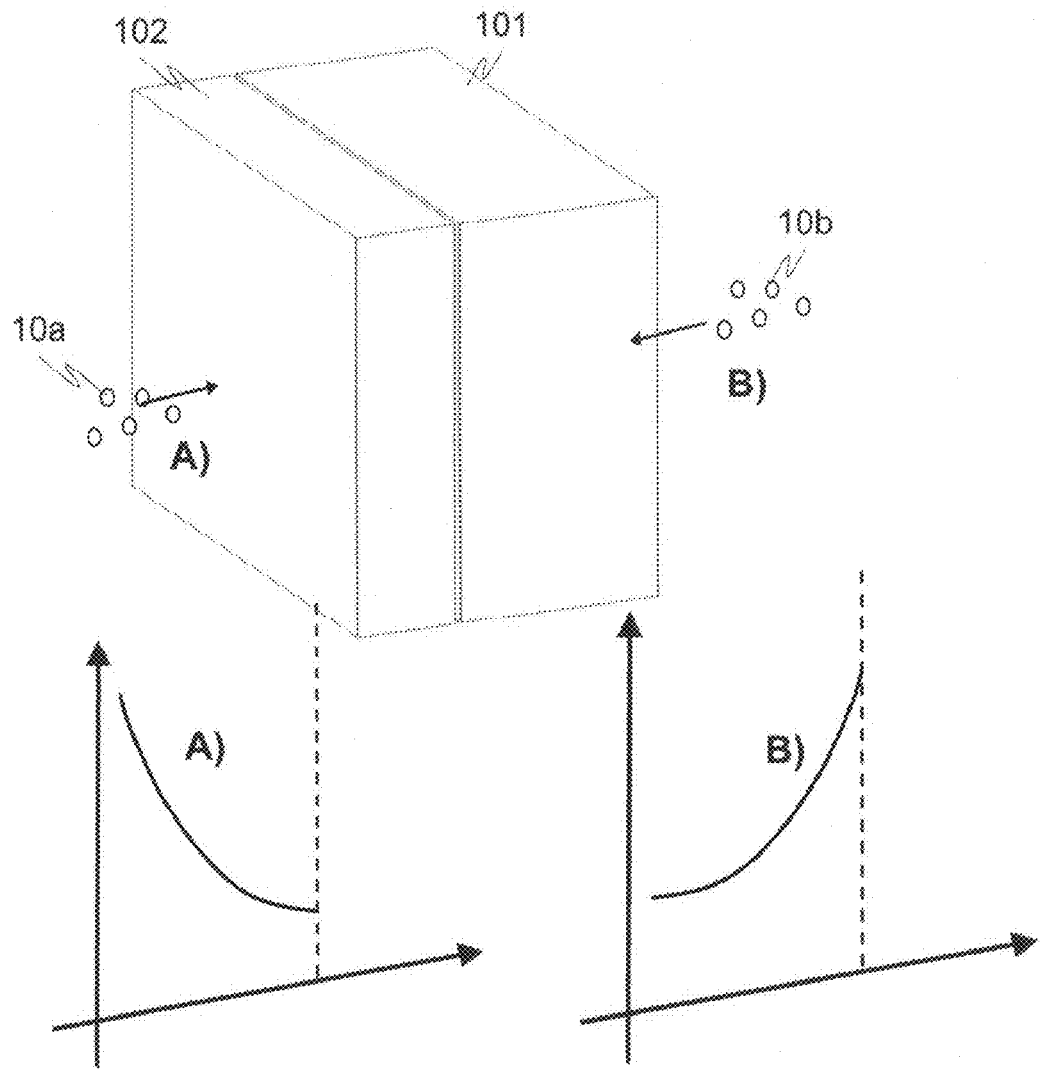
FIG. 4A
FIG. 4B

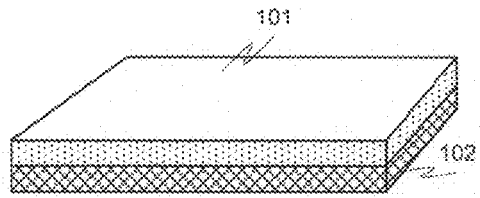
FIG. 8A
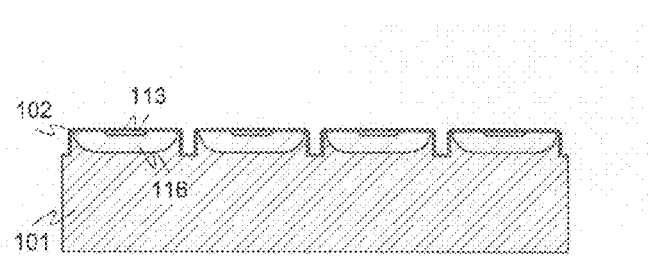
FIG. 8B
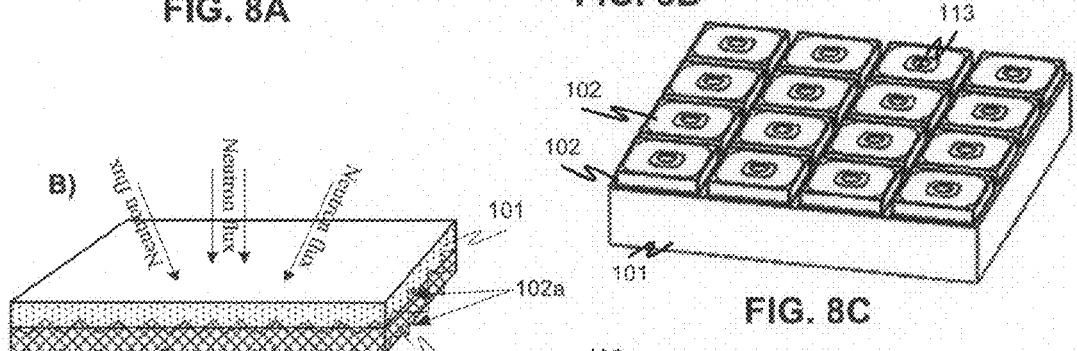
FIG. 9 / FIG. 8C
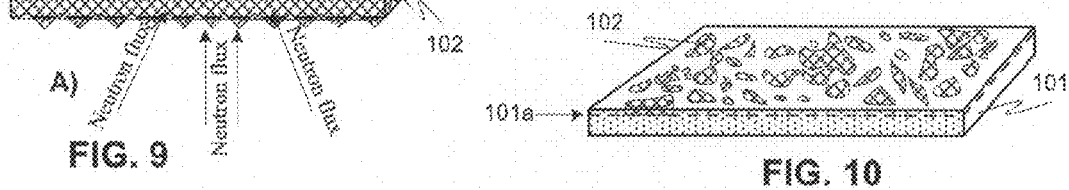
FIG. 10
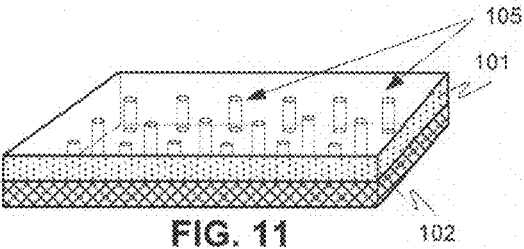
FIG. 11
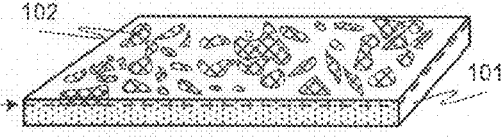
FIG. 12
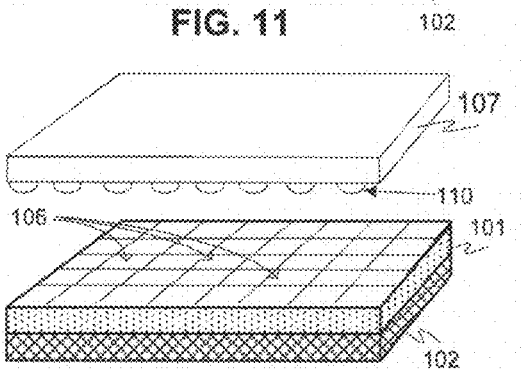
FIG. 13
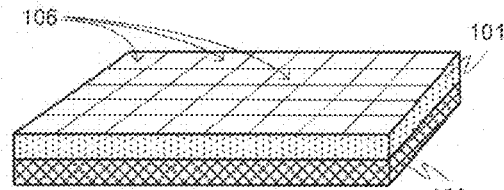
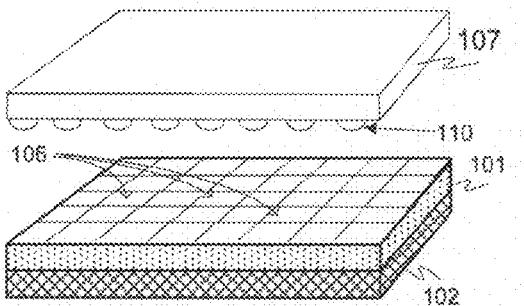
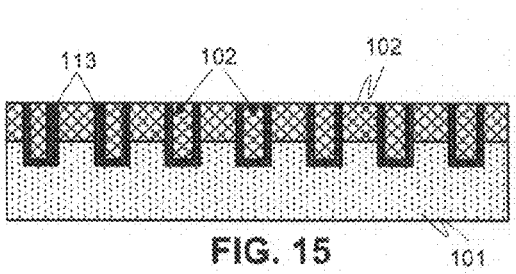
FIG. 15
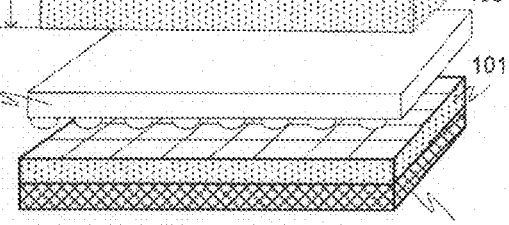
FIG. 14

ULTRA THIN NEUTRON DETECTOR, METHOD FOR MANUFACTURING THE NEUTRON DETECTOR AND NEUTRON IMAGING APPARATUS

TECHNICAL FIELD OF THE INVENTION

The invention relates especially to a neutron detector, method for manufacturing said detector, and neutron imaging apparatus.

BACKGROUND OF THE INVENTION

Different kinds of detectors are known from the prior art for detecting, tracking, and/or identifying ionizing radiation and high-energy particles, such as particles produced by nuclear decay, cosmic radiation, or reactions in a particle accelerator. Some examples of ionizing radiation types and particles producing ionizing radiation via collisions with other particles are: Alpha particles (helium nuclei), beta particles (electrons), neutrons, gamma rays (high frequency electromagnetic waves, X-rays, are generally identical to gamma rays except for their place of origin), and charged hadrons, as an example. Neutrons are not themselves ionizing but their collisions with nuclei lead to the ejection of other charged particles that do cause ionization.

There are dedicated detectors for different type of radiation and particles. To detect radiation, the interaction process with matter is utilized where the interacting medium converts the invisible radiation to detectable signals. If the radiation consists of charged particles, such as alphas, electrons or positrons, the electromagnetic interaction create charges which can be collected and detected. It can also initiate further processes, which can give rise to registable signals in the detector medium. The radiation or particle (such as neutrons) has to interact with matter and transfer its energy to charged particles (e.g. electrons). For example the electrically neutral gamma radiation interacts with matter with electromagnetic processes and transfer part or all its energy to charge carriers. For the registration of thermal neutrons, neutron capture is needed that results e.g. in a charged particle (such as an alpha particle).

All detectors use the fact that the radiation interacts with matter, mostly via ionization. The detector converts deposited energy of the ionizing radiation to registered signals, usually electric signals. The interaction with the radiation takes place in an interacting medium and creates charges that are collected and detected. A very typical detector nowadays is a semiconductor detector that uses a semiconductor (usually silicon or germanium) to detect traversing charged particles or the absorption of photons. In the semiconductor detectors radiation is measured by means of the number of charge carriers set free in the detector, which is arranged between two electrodes. The number of the free electrons and the holes (electron-hole pairs) produced by the ionizing radiation is proportional to the energy transmitted by the radiation to the semiconductor. As a result, a number of electrons are transferred from the valence band to the conduction band, and an equal number of holes are created in the valence band. Under the influence of an electric field, the electrons and the holes travel to the electrodes, where they result in a pulse that can be measured in an outer circuit. The holes travel into the opposite direction than the electrons and both can be measured. As the amount of energy required to create an electron-hole pair is known, and is independent of the energy of the incident radiation, measuring the number of electron-hole pairs allows the energy of the incident radiation to be measured.

The semiconductor detectors are based on a wafer, which is a thin slice of semiconducting material, such as a silicon crystal, upon which e.g. microcircuits are constructed by doping (for example, diffusion or ion implantation), chemical etching, and deposition of various materials. Most silicon particle detectors work, in principle, by diode structure on silicon, which are then reverse biased. A diode is a component that restricts the directional flow of charge carriers. Essentially, a diode allows an electric current to flow in one direction, but blocks it in the opposite direction. As charged particles pass through these diode structures, they cause small ionization currents which can be detected and measured. Arranging thousands of these detectors around a collision point in a particle accelerator can give an accurate picture of what paths particles take.

An example of a silicon detector for detecting high-intensity radiation or particles is illustrated by WO 2009/071587, where the detector comprises a silicon wafer having an entrance opening etched through a low-resistivity volume of silicon, a sensitive volume of high-resistivity silicon for converting the radiation particles into detectable charges, and a passivation layer between the low and high-resistivity silicon layers. The detector further comprises electrodes built in the form of vertical channels for collecting the charges, wherein the channels are etched into the sensitive volume, and read-out electronics for generating signals from the collected charges. The detector is constructed to take in the radiation or particles to be detected directly through the passivation layer and in that the thickness of the sensitive layer having been selected as a function of the mean free path of the particles to be detected.

The detector of WO 2009/071587 is manufactured by using a semiconductor-on-insulator (SOI) wafer, which comprises two outmost layer of n-type silicon and an intermediate layer of silicon dioxide. The manufacturing method is mainly characterized by the steps of selecting the thickness of one the silicon layer to be the sensitive layer at the front surface as a function of the mean free path of the particles to be detected, growing or depositing an insulation layer on both surfaces of the wafer by leaving open a window, etching holes into the layer to constitute the sensitive layer to reach the silicon oxide layer, doping the holes to create electrodes, depositing and patterning a metal layer at the front surface of the wafer and routing the metal layer to read-out electronic, and forming a window in the back surface of the wafer to reach the silicon oxide layer.

The detector of WO 2009/071587 can be used e.g. for detecting high-intensity radiation particles by having radiation or particles entering through the entrance window into the detector, ionizing the neutral atoms within the sensitive volume of high-resistivity silicon, applying a voltage between electrodes etched into the sensitive volume, and detecting the signals caused as a result of the contact with the electrodes by means of read-out electronics. The detector can also have a polyethylene moderator at the entrance window for detection of neutrons.

Also some other neutron detectors are known from prior art, such as a detector of WO 2007/030156 A2, where semiconductor-based elements as an electrical signal generation media are utilized for the detection of neutrons. Such elements can be synthesized and used in the form of, for example, semiconductor dots, wires or pillars on or in a semiconductor substrate embedded with matrixes of high cross-section neutron converter materials that can emit charged particles as reaction products upon interaction with neutrons. These charged particles in turn can generate electron-hole pairs and thus detectable electrical current and voltage in the semiconductor elements.

Especially WO 2007/030156 A2 discloses an apparatus for detecting neutrons, comprising: a substrate capable of producing electron-hole pairs upon interaction with one or more reaction-produced particles; a plurality of embedded converter materials extending into said substrate from only a single predetermined surface of said substrate, wherein said embedded converter materials are configured to release said reaction-produced particles upon interaction with one or more received neutrons to be detected, and wherein said embedded converter materials are adapted to have at least one dimension that is less than about a mean free path of said one or more reaction-produced particles to efficiently result in creating said electron-hole pairs; and at least one pair of non-embedded electrodes coupled to predetermined surfaces of said substrate, wherein each electrode of said at least one pair of electrodes comprises a substantially linear arrangement, and wherein signals from resulting electron-hole pairs as received from a predetermined said at least one pair of electrodes are indicative of said received neutrons. The pillars are individually coupled to signal collection electronics so as to indicate the direction of said received neutrons.

In addition WO 2004/040332 discloses neutron detector, which utilizes a semiconductor wafer with a matrix of spaced cavities filled with one or more types of neutron reactive material such as $^{10}$B or $^{6}$LiF for releasing radiation reaction products in relation to the interactions with neutrons. The cavities are etched into both the front and back surfaces of the device such that the cavities from one side surround the cavities from the other side. The cavities may be etched via holes or etched slots or trenches. In another embodiment, the cavities are different-sized and the smaller cavities extend into the wafer from the lower surfaces of the larger cavities. In a third embodiment, multiple layers of different neutron-responsive material are formed on one or more sides of the wafer. The new devices operate at room temperature, are compact, rugged, and reliable in design.

There are however some problems related to the known prior art solutions, namely since most of the neutron sources or reactions are accompanied by a gamma or X-ray background and because the neutral gamma or X-ray radiation interacts with the semiconductor matter of the detectors, the gamma or X-ray background will disturb the accurate measuring, which is an undesired effect especially in connection with neutron imaging apparatuses.

SUMMARY OF THE INVENTION

An object of the invention is to alleviate the drawbacks related to the known prior art detectors. Especially an aim of the invention is to provide a detector, which is sensitive for detecting neutrons but at the same time "transparent" for the background gammas and/or X-rays. In addition a goal of the invention is to provide a detector with fast charge collection and with excellent radiation hardness.

The object of the invention can be achieved by the features of independent claims.

The invention relates to a detector according to claim 1, neutron detecting device according to claim 11, arrangement according to claim 12, neutron imaging apparatus according to claim 15 and method of manufacturing the detector according to claim 16.

According to an advantageous embodiment of the invention the detector comprises a neutron reactive material functioning as a neutron sensitive converter adapted to interact with neutrons to be detected and release ionizing radiation reaction products or recoil nucleus in relation to said interactions with neutrons, such as $^{7}$Li, $^{3}$H, $^{155}$Gd, $^{158}$Gd, $^{114}$Cd, proton, alpha particle, triton particles, fission fragments, electrons of internal conversion and/or gamma photons depending of the neutron reactive material used in the detector.

In addition the detector advantageously comprises first semiconductor element being coupled with said neutron reactive material and adapted to interact with said ionizing radiation reaction products and provide electrical charges (electron-hole pairs) proportional to the energy of said ionizing radiation reaction products. The first semiconductor element is advantageously silicon wafer, but also other semiconducting material can be used, such as e.g. gallium arsenide (GaAs) or cadmium telluride (CdTe).

The detector also comprises electrodes, which are arranged in connection with said first semiconductor element for providing charge collecting areas and for collecting the electrical charges generated by the ionizing radiation reaction products upon interacting with said first semiconductor. The detector also comprises read-out electronics electrically connected with said electrodes to provide electrically readable signal proportional to said collected electrical charges.

According to the embodiment the thickness of the first semiconductor element is advantageously adapted to be electrically (depletion layer) and/or physically so thin that it is essentially and practically transparent for incident photons, such as background gamma photons. According to an exemplary embodiment said thickness of said first semiconductor element is about 10 µm. According to an advantageous embodiment of the invention the thickness of said first semiconductor element is between 10-30 µm.

The thinness of the first semiconductor element can be achieved e.g. either by physically removing the semiconductor material (mechanically back thinning) or by appropriately doping the semiconductor so as to create only a thin active layer or i.e. electronically by arranging the electrodes to collect charges within a certain depth only (in the back side).

The ultra thin detector offers clear advantages over the known prior art, because when the thickness of the first semiconducting layer is at the range of 10-30 µm, the incoming photons, such as background gammas or X-rays do not essentially interact with the semiconducting layer. For example, when the thickness of the semiconducting layer is about 10 µm, much less than 0.1% of background gammas will interact with it, which is clearly negligible. Thus a thin layer of e.g. silicon or equivalently a thin charge collection region within a silicon detector represents negligible conversion probability for incoming photons. For soft X-rays the conversion probability is highest, but still remains below fractions of a percent for an effective Si-detector thickness of 10 micrometers. The ultra thin detector (especially ultra thin first semiconductor and converter material) enables e.g. imaging, because of the transparency for gamma and X-ray photons. In addition, when the detector is ultra thin the charge carriers produced can be effectively caught by charge collecting areas, such as electrodes.

The neutron reactive material forms advantageously a neutron sensitive converter. According to an embodiment also the thickness of the neutron sensitive converter may be adapted to be physically so thin that it is essentially and practically transparent for incident photons, such as background gamma photons. According to an exemplary embodiment the thickness of the neutron sensitive converter is 10-30 µm at maximum. The thinness of the neutron sensitive converter can be achieved by the manufacturing method, wherein the neutron reactive material is arranged on and/or inside the first semiconductor element by applying a surface deposition method, such as laser ablation, atomic layer deposition (ALD), photolithography or sputtering technique.

According to an embodiment the neutron reactive material may be introduced on the surface of the semiconductor element as a neutron sensitive converter layer. However, according to another embodiment also other forms can be applied. For example, the first semiconductor element may be provided additionally with pores, like pillars, channels, grooves and/or other cavities, which are then filled with the neutron reactive material. According to an embodiment the neutron reactive material may also be ion-implanted inside the structure of said first semiconductor and advantageously in the surface layer in the proximity to the charge collecting areas so that the release ionizing radiation reaction products can effectively reach the first semiconductor and that the generated electron-hole pairs can be effectively caught by said charge collecting areas.

According to an advantageous embodiment the neutron reactive material may be arranged also between the first semiconductor element and the read-out electronics coupled with said first semiconductor element. In addition the neutron reactive material may be applied also on the surface of said first semiconductor element and/or on the surface of said read-out electronics. In addition according to an embodiment the neutron reactive material may be adapted to form a neutron sensitive converter, which has at least one surface the shape of which is complex or rugged, such as sawtooth-like. Furthermore according to an advantageous embodiment neutron reactive material may be arranged as clusters on and/or in the surface of the first semiconductor element, between the read-out electronics and the first semiconductor element, and/or on the surface of the first semiconductor element. This can be achieved for example by the laser ablation illustrated elsewhere in this document.

The above embodiments, where the neutron reactive material is applied in different places and has complex or rugged shapes in the detector maximize the surface area of the neutron reactive material in the detector so that more neutrons will interact with the neutron reactive material. This offers clear advantages, such as increases the efficiency for converting incident neutrons to reaction products. In addition neutrons may also interact with the neutron reactive material near the read-out electronics, the first semiconductor element and especially the charge collecting areas (electrodes) which makes the detector very effective for detecting neutrons. In addition the distances for the generated reaction products from the origin to the semiconductor and electrodes can be effectively minimized which further improve the effectiveness of the detector.

According to an embodiment of the invention the detector may also comprise in addition a second semiconductor element, which is typically much thicker than the first semiconductor element coupled with the neutron reactive material. According to an example the second semiconductor element is several hundred times thicker than the first one, advantageously several millimeters, and according to an example of the order of 5 mm. The second semiconductor element is advantageously so thick that it is sensitive for the gamma photons generated by the neutrons when interacting with the neutron reactive material. In addition the second semiconductor element is adapted provide electrical charges (electron-hole pairs) proportional to the energy of said gamma photons. According to an embodiment the second semiconductor element may be used e.g. to determine the kinematic of the detected neutrons, such as e.g. a path of the gamma photon generated by the neutron in the neutron reactive material or reaction place of the neutron in the neutron reactive material, as well as also energy of the incident neutron. Thus, when the kinematic (momentum or energy and direction) of the gamma photon and the energy of the reaction product is determined, the source or origin of said incident neutron can be identified.

According to an embodiment the detector comprises or is coupled with additional coincidence means for providing a time window during which the gamma photons are detected by the second semiconductor element. The starting point of the time window may be triggered by the interaction of the neutron with the neutron reactive material generating said gamma photon, or practically by the electrical signal generated by the electrodes of the first semiconductor element due to detecting generated electron-hole pair as discussed elsewhere in this document. This ensures that the gamma photon, for example, detected by the second semiconducting element is produced by the neutron interacting with the neutron reactive material thus excluding for example undesired background gamma or X-ray photons. Also energy discrimination can be applied to exclude undesired background gamma or X-ray photons the energy of which clearly differs from that of the gamma photons generated by the detected neutrons in the neutron converting material.

It should be noted that the first and/or second semiconductor elements illustrated in the above embodiment can be electrically divided into plurality of areas or pixels, whereupon the accurate location of the neutrons hit the detector or at least the reaction products generated by the neutrons can be determined. The dividing can be achieved e.g. by plurality of electrodes applied in and/or on the semiconducting material so that the electrical charges generated in the semiconductor element is adapted to be collected by the nearest electrode. Thus the location of the generated electrical charge is determined based on the location of the electrode collecting said electrical charge.

The read-out electronics may be implemented e.g. by an ASIC or similar chip, which may be flip-chip bonded with the electrodes of the semiconductor element e.g. via bump bond elements. The read-out electronics are advantageously adapted to detect the charges collected by the electrodes and generate electric signals proportional to the collected charges either sensitive for the location or not. According to an embodiment the read-out electronics may be implemented only for detecting counts (whereupon the electrodes may be short-circuited, because the location information is not needed), but according to another embodiment also for determining dose or even for providing information for neutron imaging, especially when the location information is also provided.

Possible nuclei for the neutron converter materials are for example:

| $^{10}B(n, \alpha)$ | | |
|---|---|---|
| $^{10}B + n \rightarrow$ | $^{7}Li + \alpha$ | 2.792 MeV (6%) |
| | $^{7}Li^* + \alpha + \gamma(0.48\ MeV)$ | 2.310 MeV (94%) |
| | $E_{Li} + E\alpha = Q = 2.31$ | |
| | $m_{Li}v_{Li} = m_\alpha v_\alpha$ | |
| | $\sqrt{2m_{Li}E_{Li}} = \sqrt{2m_\alpha E_\alpha} \Rightarrow$ | $E_{Li} = 0.84$ MeV, $E_\alpha = 1.47$ MeV (94%) |
| | | $E_{Li} = 1.01$ MeV, $E_\alpha = 1.78$ MeV (6%) |

The neutron capture cross section: σ=3842 b (0.0253 eV). The natural boron has abundance of $^{10}$B 19.8%.

| $^6$Li(n, α) | |
|---|---|
| $^6$Li + n → $^3$H + α<br>$E_{3H}$ = 2.73 MeV, $E_α$ = 2.05 MeV | 4.78 MeV |

The neutron capture cross section: σ=942 b (0.0253 eV). The natural lithium has abundance of $^6$Li 7.40%.

| $^3$He(n, p) | |
|---|---|
| $^3$He + n → $^3$H + p<br>$E_{3H}$ = 0.191 MeV, Ep = 0.573 MeV | 0.764 MeV |

The neutron capture cross section: σ=5320 b (0.0253 eV) It is commercially available, but expensive material.
$^{155}$Gd

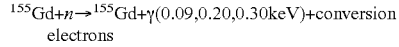
$^{155}$Gd+n→$^{155}$Gd+γ(0.09,0.20,0.30keV)+conversion electrons

The neutron capture cross section: σ=60791 b (0.0253 eV) $^{157}$Gd

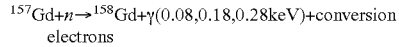
$^{157}$Gd+n→$^{158}$Gd+γ(0.08,0.18,0.28keV)+conversion electrons

The neutron capture cross section: σ=255011 b (0.0253 eV). Natural gadolinium has abundance of 15.70% of $^{157}$Gd, it emits gamma photons. In 39% of captures conversion electrons with energy mainly of 72 keV are emitted (electrons with higher energies are also emitted). The conversion efficiency can reach up to 30%.
$^{113}$Cd

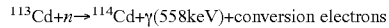
$^{113}$Cd+n→$^{114}$Cd+γ(558keV)+conversion electrons

The neutron capture cross section: σ=20743 b (0.0253 eV).

BRIEF DESCRIPTION OF THE DRAWINGS

The file of this patent contains at least one drawing executed in color. Copies of this patent with color drawings will be provided by the Patent and Trademark Office upon request and payment of the necessary fee.

Next the invention will be described in greater detail with reference to exemplary embodiments in accordance with the accompanying drawings, in which:

FIGS. 3A-B illustrate dependencies of neutron detection efficiencies as functions of the neutron converter thickness for $^6$LiF and $^{10}$B converters. (Both types of the converters show an optimal thickness at which the detection efficiency is the highest. It is about 5% for both types of converters.)

FIGS. 4A-B illustrate schematics of converter side (a) and detector side (b) irradiation showing the numbers of neutrons captured in the neutron converter, FIG. 8A illustrates an example of a physically thin planar semiconductor detector of neutrons with a neutron converter deposited on the surface according to an advantageous embodiment of the invention, FIGS. 8B-C illustrates examples of a thin semiconductor neutron detector with a neutron converter deposited on the surface according to an advantageous embodiment of the invention, FIG. 9 illustrates an exemplary semiconductor detector, where the converter has more complex or rugged shape both in outer surface and the surface coupled with the detector sensitive volume according to an advantageous embodiment of the invention, FIG. 10 illustrates an exemplary detector with neutron reactive material on its surface according to an advantageous embodiment of the invention, FIG. 11 illustrates an exemplary semiconductor detector with pores according to an advantageous embodiment of the invention, FIG. 12 illustrates an exemplary pixelization of the detector in order to detect both the neutron collision and its location on the detector according to an advantageous embodiment of the invention, FIG. 13 illustrates an exemplary semiconductor detector with a readout chip according to an advantageous embodiment of the invention, FIG. 14 illustrates an exemplary semiconductor detector with an additional second semiconducting element according to an advantageous embodiment of the invention, FIG. 15 illustrates an exemplary neutron detector with electrodes comprising neutron reactive material according to an advantageous embodiment of the invention.

DETAILED DESCRIPTION

I Detector Structure—Neutron Converter

The semiconductor detectors (e.g. illustrated in FIGS. 1 and 10-16) are typically adapted for the thermal neutron detection and imaging, and are supplemented with a material (neutron reactive material) which "converts" neutrons into reaction products. The reaction products advantageously transfer its energy to charge carriers, which can be electrically detected directly in the semiconductor detector. Silicon is very commonly used in the detectors but there are besides silicon also other types of semiconductor materials which can be used, such as silicon carbide, germanium, gallium arsenide (GaAs), gallium phosphide, gallium nitride, indium phosphide, cadmium telluride (CdTe), cadmium zinctelluride (CdZnTe), mercuric iodide, lead iodide, and composite materials based on boron nitride (BN) or lithium fluoride (LiF). Their advantage is that the neutron converting material can be presented directly in their volume. For example silicon walls of even 10 µm thick or less can detect heavy charged particles which are products of neutron capture e.g. on $^6$Li or $^{10}$B.

The semiconductor neutron (imaging) detectors according to the invention can have high spatial resolution, high dynamic range and can suppress gamma and electron background efficiently. Both can be achieved while having high detection efficiency for thermal neutrons.

Figure 1:
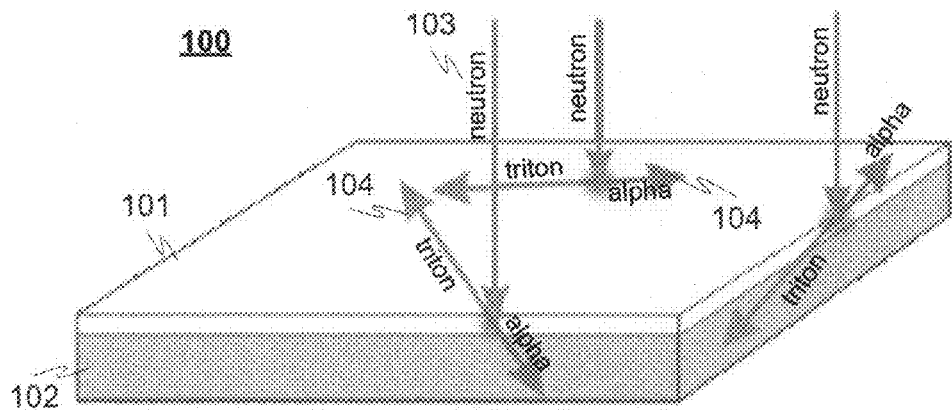
FIG. 1 illustrates an exemplary planar semiconductor detector of neutrons with a neutron converter deposited on the surface according to an embodiment of the invention.

The semiconductor neutron detectors can be divided into groups determined by how the converter, i.e. the neutron reactive material, is implemented in the detector:

1° The first type is a planar neutron semiconductor detector, such as is depicted in FIGS. 1 and 10. It may be e.g. a simple planar diode where the PN junction is parallel to the detector surface. The neutron converter may be deposited on the detector surface. Fabrication of such detector is simple, but its neutron detection efficiency is limited. The neutron detection efficiency is defined as a ratio of detected and incident neutrons. The reason for the limited detection efficiency of the planar detectors is that all the particles created in the converter by the neutron capture cannot reach the detector sensitive volume, as can be seen from FIG. 1, for example.

2° The second type are so called 3D detectors, such as is depicted in FIGS. 6 and 11-13. The abbreviation "3D" stands for 3D structures created inside, but also on the surface the detector, where the shape, such as surface of the neutron converter is complex or rugged. The current semiconductor technologies allow fabrication of advanced surface structures in the semiconductor. Such structures can be filled by a neutron reactive material. The 3D structures increase the surface area between the neutron converter and the detector material and thereby also the surface area of the neutron converter. Thus, they increase the probability that incident neutrons will be converted and detected. This also increases the probability that particles created in the converter by neutron capture will be detected in the sensitive volume of the detector. It should be noted that at least part of the 3D-structures (such as pores or pillars inside the semiconducting material) may also be dedicated for electrodes, which increases the probability that charges (such as electron-hole pairs) created in the semiconducting element will be detected.

Converter Materials:

Most of the semiconductor detectors are not able to detect neutrons directly. A material which "converts" neutrons into particles detectable by the semiconductor is necessary. Such material is called the "neutron converter" or neutron reactive material. The converter materials which produce e.g. heavy charged particles have two significant advantages. The first advantage is that the heavy charged particles detected in the detector sensitive volume deposit a large amount of energy and therefore create a high signal, which allows an easy discrimination of the background other than neutrons. It is an important feature because most of the neutron sources are accompanied by a gamma background. The second advantage applies mainly to neutron imaging detectors. The relatively short range of heavy charged particles in the semiconductor material allows a design of neutron imagers with a higher spatial resolution, since the ranges of the heavy charged particles are short.

One parameter to be noticed when selecting the material is a range of neutron capture products in the matter and the range of conversion electrons and gammas versus a pixel size of the imaging detector. Moreover it should be noticed that the eventually detected electron can be generated by Compton scattering or photo effect at a different place than where the neutron was captured. This will deteriorate the imaging detector spatial resolution as well. These are reasons why the selection of the neutron converter material is important.

The used neutron reactive material may be same or different in different places of the detector and comprises according to an embodiment at least one predetermined converter material comprising: $^{10}$B, $^6$Li, $^3$He, $^{155}$Gd, $^{157}$Gd, $^{113}$Cd, cadmium telluride (CdTe), cadmium zinc telluride (CdZnTe), or composite materials based on boron nitride (BN) or lithium fluoride (LiF, which is essentially transparent for incident photons, such as gammas). Typically the neutron reactive material is selected so that it's Z-number is as high as possible.

FIG. 1 illustrates an exemplary planar semiconductor detector 100 of neutrons with a neutron converter 101 deposited on the surface of the semiconducting material 102 according to an embodiment of the invention. The detector 100 is based on a planar diode detector, where the thermal neutrons 103 are captured in the 6Li (which is in form of LiF compound) converter 101 and secondary particles 104 are produced. These particles 104 are subsequently detected by the semiconducting material 102 of the detector 100.

However, the planar converter has its limitations. The probability of neutron capture in the converter is increasing with the increasing thickness of the converter layer. On the other hand, with the growing converter thickness the chance that the neutron capture products from the most distant converter levels will reach the detector sensitive volume also decreases. For a particular converter type an optimal converter thickness has to be found. Unfortunately, this limited effective thickness also limits the overall neutron detection efficiency (the detector sensitivity). Important parameters which determine the design of the neutron converter are ranges of neutron capture products in matter.

Figure 2A:
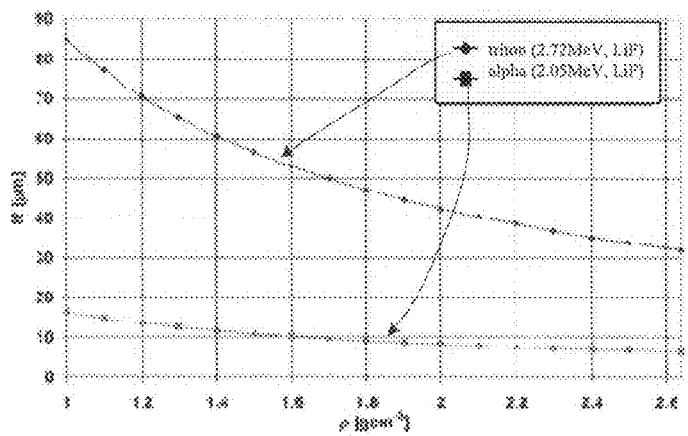
FIGS. 2A-C illustrate exemplary charts for ranges of alphas and/or tritons in LiF of different effective density, where alpha particles and tritons are products of neutron capture on $^6$Li.

FIG. 2A illustrates an exemplary chart for ranges of tritons and alphas in LiF of different effective density, where alpha particles and tritons are products of neutron capture on $^6$Li, as known from prior art. According to an exemplary embodiment the LiF converter may be in form of powder and therefore it can be pressed and have virtually an arbitrary effective density almost up to density of LiF crystal which is 2.64 g/cm$^3$. LiF may be enriched by $^6$Li to 89%.

Figure 2B:
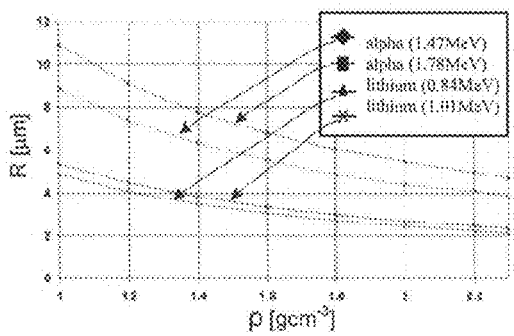

The range of tritons in silicon crystal is 44.1 µm and the range of alpha particles is 8.6 µm. FIG. 2B contains results of a similar simulation but for amorphous boron powder illustrating ranges of alpha particles and lithiums which are products of the neutron capture in $^{10}$B, as known from prior art. It is clear that ranges of heavy charged particles are shorter than in the case of LiF. Ranges of products of neutron capture on $^{10}$B are in Si: $R_{Li}$=3 µm/2.7 µm, $R_\alpha$=5.4 µm/5.2 µm.

Figure 2C:
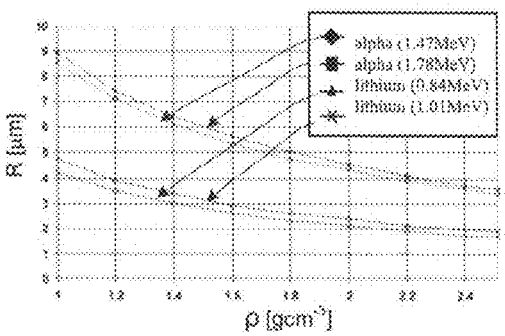

The curves in FIG. 2C are heavy charged particle ranges as functions of B$_4$C density, as known from prior art. B$_4$C is an example of a boron compound usable as a neutron converter. It is possible to calculate such dependencies for any boron or lithium compound. However, a common property of all of them will be significantly shortened range of neutron capture products for $^{10}$B in comparison with $^6$Li. This somehow predetermines the applicability of converters based either on $^6$Li or $^{10}$B. The advantage of $^{10}$B over $^6$Li in the higher thermal neutron capture cross section is reduced by the shorter ranges of the capture products. This effect will be even more clear if the heavy charged particles will have to pass through a thicker layer of metallic contacts or a thicker insensitive layer in the semiconductor detector. All the results of heavy charged particles ranges are also applicable on other types of detectors which use the same thermal neutron converters.

Neutron Detection Efficiency

FIGS. 3A-B illustrate dependencies of neutron detection efficiencies as functions of the neutron converter thickness for $^6$LiF and $^{10}$B converters, where both types of the converters show an optimal thickness at which the detection efficiency is the highest, which is about 5% for both types of converters, as known from prior art. It can be seen from FIGS. 3A-B that the effect of the lower neutron capture cross section of $^6$Li can be in comparison to $^{10}$B well compensated by longer ranges of secondary particles. The probability that neutrons will be captured in the $^{10}$B converter is higher, but on the other hand the shorter ranges of neutron capture products from $^{10}$B prevent them reaching the detector sensitive volume and create a sufficient signal. Secondary particles born in the converter layer most distant from the silicon surface should be still capable reaching the sensitive detector volume and leave a detectable amount of energy there. Thus, the converter thickness should be limited to a value of the longest particle range in the converter material. A lower converter thickness increases the chance that heavy charged particles will reach the sensitive volume, but it reduces the probability that neutrons will interact inside the converter. The overall maximum detection efficiency of ~5% is similar for both types of converters. However, $^{10}$B can offer a better spatial resolution when applied on a neutron imaging device which has a pixel size comparable or lower than ranges of flight of the neutron capture products. A way to overcome the limited detection efficiency is to introduce more complex geometrical structures of the surface between the neutron converter and the detector sensitive volume. According to an embodiment the surface of the neutron converter may be e.g. rugged or other way complex so that its surface area will be increased.

Neutrons follow the exponential attenuation law when passing through the material. FIGS. 4A-B illustrate schematics of the converter side (a) and the detector side (b) irradiation showing the numbers of neutrons captured in the neutron converter. When neutrons 10a enter from the converter 102 side A) more neutrons are captured and converted away from the detector surface (i.e. in the part of the neutron reactive material 102 locating most far from the semiconducting element 101). When neutrons 10b enter from the detector 101 side B) more neutrons are captured and absorbed in the neutron reactive material 102 close to the semiconducting element surface 101 where the probability that the conversion alphas escape the converter 102 and penetrate into the semiconducting element 101 is higher.

The heavy charged particles created close to the outer surface must fly through a thicker layer of the converter to reach the sensitive volume. Therefore, a chance that such particles will be detected in the sensitive volume is lower. Apparently, this effect becomes even more significant for thick converters (i.e. with a thickness comparable or higher than ranges of charged particles in the matter of converter).

Since the semiconductor materials are in most cases transparent for neutrons it is possible to irradiate the whole detector structure from the backside. Neutrons pass through the semiconductor first and are then captured in the converter. Indeed, a higher number of neutrons are captured closer to the boundary between the semiconductor and the converter. The probability that products of the neutron capture will reach the sensitive volume is higher and the overall detection efficiency is higher. Moreover, the converter thickness does not have to be optimized and can be even thicker than the range of the heavy charged particles.

Figure 5:
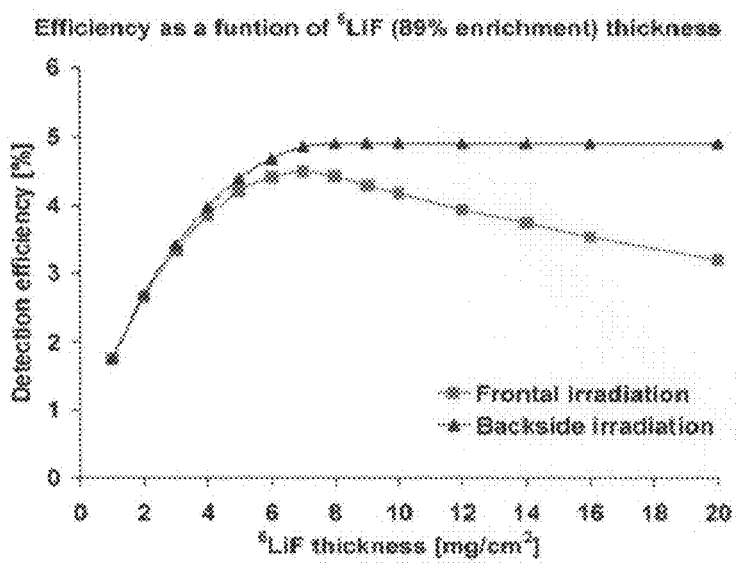
FIG. 5 illustrates detection efficiency as a function of the LiF converter thickness for the front and backside irradiation.

FIG. 5 illustrates the difference in detection efficiency as a function of the LiF converter thickness for the front and backside irradiation, wherein the LiF is enriched in $^6$Li to 89%, as known from prior art. In both cases the detection efficiency is increasing up to a layer thickness of about 7 mg/cm$^2$. It is a surface density which is equal to the maximal range of tritons in LiF. The curve exhibited a maximum of 4.48% at this converter thickness in the case of the front irradiation. From this thickness is the detection efficiency decreasing for irradiation of the front side, but remains constant at 4.90% for the back side irradiation. If the detector is irradiated from the back side the converter is active only to the depth which is equal to the longest range of neutron capture products. Deeper converter layers do not contribute to the neutron detection at all and the detection efficiency stays constant with the increasing converter thickness.

However, the effect of the back side irradiation is not significant for thin converter layers, which can also be seen from FIG. 5. The advantage of the back side irradiation is that it is not necessary to control the converter thickness during the deposition precisely and that the reaction product will more effectively reach the semiconducting material where they produce detectable electrical signals, such as electron-hole pairs. In principle it is enough to deposit a layer thicker than the range if the heavy charged particles from the neutron capture reaction. The detection efficiency is the maximal achievable with this geometrical configuration.

The neutron detection efficiency depends also as on a function of a pore size and shape, such as whether the shape of pore is square or cylindrical, but also the density of the neutron reactive material. Square (or cylindrical) pores can be relatively easily fabricated and allow a good filling ratio of the detector with a neutron converter.

The detection efficiency typically increases with increasing converter density, such as especially in the case of the LiF filled structure. This is due to the increasing macroscopic cross section for neutron capture $\Sigma=\sigma \cdot n$, where $\sigma$ is microscopic neutron capture cross section and n is number of converter nuclei per unit of volume. The range of heavy charged particles remains sufficient to escape the pore even with the increasing density. The situation is opposite in the case of $^{10}$B. The highest detection efficiency can be reached with a lower density of the converter. More important is here the effect of the heavy charged particle range extension with the decreasing density. The macroscopic cross section $\Sigma$ remains sufficiently large with the decreasing density, i.e. the number of converter nuclei per volume unit.

The highest reached detection efficiencies are lower than in the case of square pores. The cylindrical pores do not fill up the volume of the detector as much as the square pores. There is more silicon in between pores and thus this volume is insensitive to neutrons. The ratio of the pore top surface and the surface of surrounding silicon is higher for square pores and therefore the overall efficiency is higher. The cylindrical pores, however, should not be abandoned hence the bigger volume of silicon around pores may allow also better charge collection efficiency.

An exemplary way according to an embodiment of the present invention to provide more efficiency is to introduce a complex or rugged, such as e.g. a sawtooth like surface between the neutron converter and the detector sensitive volume (as disclosed in FIGS. 7A-D, for example). The detector may contain an array of inverted pyramidal dips created e.g. by anisotropic etching of silicon with KOH (Potassium Hydroxide).

According to an embodiment the surface between the neutron converter and the detector may be doubled. Contrary to the planar detector case the spectrum now contains events above 2.73 MeV, because both particles (alpha and triton) can be detected simultaneously if the reaction takes place in the region close to the sawtooth tip. Once again the detector can be irradiated from the back side.

According to an embodiment the converter material comprises at least one of the following: $^{10}$B, $^6$Li, $^3$He, $^{155}$Gd, $^{157}$Gd, $^{113}$Cd or cadmium telluride (CdTe) or composite materials based on boron nitride (BN) or lithium fluoride (LiF), or CdZnTe. According to an embodiment it is desirable that the Z-number of the converter material is as high as possible so that the neutrons would interact efficiently with the converter material producing detectable radiation, such as for example gamma rays, which can be detected by the detector material.

Figure 6A:
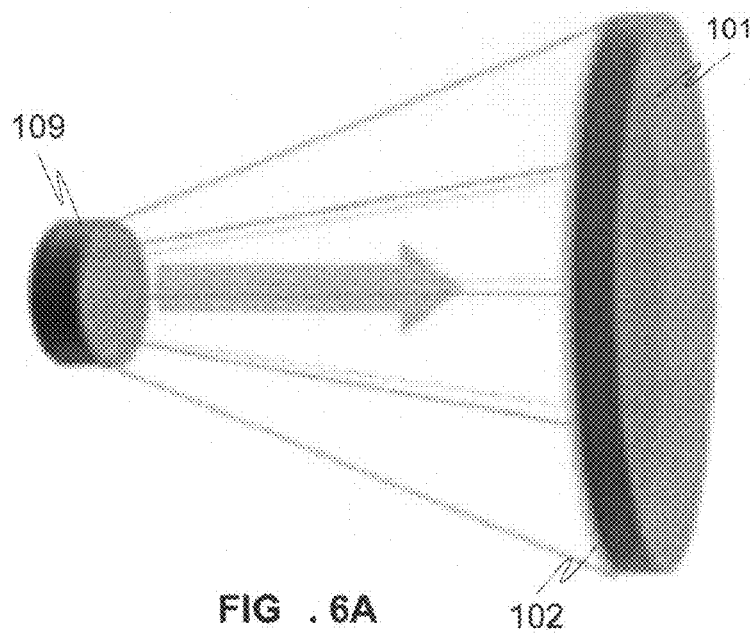
FIG. 6A illustrates an exemplary method for manufacturing a neutron detector with neutron reactive material according to an advantageous embodiment of the invention.

According to an advantageous embodiment of the present invention the neutron reactive material is coupled on and/or inside the first semiconductor element or detector in a new way, namely by applying a laser ablation. FIG. 6A illustrates an exemplary method for manufacturing a neutron detector with neutron reactive material according to an advantageous embodiment of the invention using the laser ablation, where high-power laser pulses are used to evaporate matter from a target surface.

The laser ablation based surface deposition can be divided into four stages:
1) Laser ablation of the target material 109 and creation of plasma
2) Dynamics of the plasma
3) Deposition of the ablated material on the substrate 101
4) Nucleation and growth of the film 102 on the substrate surface 101.

The manufacturing of the neutron detectors by applying the laser ablation in depositing the conversion layer offers numerous advantages. Basically any material can be used for surface deposition. In addition the low process temperature allows deposition of heat sensitive materials. The laser ablation surface deposition heats also the substrate (semiconducting layer 101) only locally and retains the material properties of the target. Moreover the surface morphology (smoothness or roughness) can be controlled, as well as also the crystallinity of the surface can be controlled from amorphous to microcrystalline. Furthermore the adhesion is superior compared to other PVD (physical vapour deposition) processes. In addition the laser ablation method is applicable also to mass production process, so it suits very well for deposition of the conversion layer overall.

It should be noted that the overall process for manufacturing the neutron detector may be implemented for example applying e.g. lithographic methods, which may comprise e.g. the following steps:
spinning of photoresist
baking of photoresist e.g. in an oven
patterning of photoresist with a mask aligner
deposition of neutron converter (such as thin film or other shape discussed e.g. in this document) for example by sputtering, atomic layer deposition or laser ablation
lift off (removal of photoresist together with converter from detector contact pads)
Or alternatively in other order, such as:
deposition of neutron converter (such as thin film or other shape discussed e.g. in this document) for example by sputtering, atomic layer deposition or laser ablation
spinning of photoresist
baking of photoresist in an oven
patterning of photoresist with a mask aligner
etching of converter from detector contact pads
removal of photoresist
According to another embodiment the neutron reactive material may also be coupled on and/or inside the first semiconductor element by applying another surface deposition method, such as atomic layer deposition (ALD), photolithography or sputtering technique.

Figure 6B:
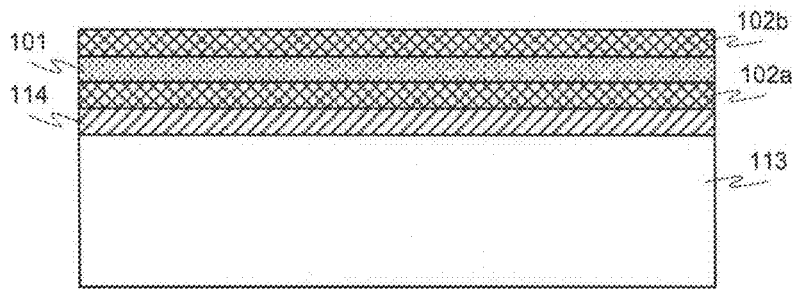
FIG. 6B illustrates another exemplary method for manufacturing a neutron detector with neutron reactive material according to an advantageous embodiment of the invention.

FIG. 6B illustrates another exemplary method for manufacturing a neutron detector with neutron reactive material according to an advantageous embodiment of the invention, where an oxide layer 114 is arranged (e.g. by ALD) on the surface of a SOI-wafer 113, such as when growing a SOI-wafer. However, according to the invention the neutron reactive material 102a is advantageously applied on the surface of the insulator 114 and in addition the semiconducting layer, such as Si-layer, is then arranged on the top of the first neutron reactive material layer 102a. In addition, according to the invention additional neutron reactive material layer 102b can be arranged on the surface of the semiconducting layer 101 in order to further enhance the neutron conversion efficiency of the detector. The multiple layer structure (102a, 102b) can be implemented also in other neutron detector depicted in this document even though not separately mentioned.

The surface deposition methods depicted above (and especially laser ablation method) have the advantage that the extremely thin detector structures can be made. For example the converter material layer 102 as well as also the first semiconductor detector material layer 101 is advantageously about 10 μm, or more advantageously 10-30 μm, as is illustrated by FIG. 8A. The invention offers clear advantages with extremely thin semiconducting detector layer, because the extremely thin semiconducting detector layer is in practice transparent to undesirable background gamma and X-ray photons, whereupon the undesirable background photons do not cause any undesirable effects. For example when the thickness of the semiconducting layer 101 is about 10 μm, much less than 0.1% of background gammas will interact with it. However, it also enables the charges to be produced by the reaction products in the first semiconductor to reach the electrodes.

FIGS. 7A-D illustrates an example of a semiconductor detector for neutrons according to an advantageous embodiment of the invention, where the first semiconducting element 101 is electrically thin (101a, most advantageously 10-30 μm), and which still enables the charges to be produced by the reaction products in the first semiconductor to reach the electrodes 112. The detector of FIGS. 7A-D comprises a neutron converter 102 advantageously deposited on the "back" surface of the first semiconductor 101, so the same side of the first semiconductor 101 than where the electrodes 112 are applied and the same side where the read-out chip will be placed (when it is used).

The detectors of FIGS. 7A-D can be manufactured e.g. by the method illustrated in FIG. 6B, where the SOI wafer 113 has an optional neutron converter layer 102a to increase the probability of neutron conversion. An applied voltage between the n+ (or p+) 3D pixel electrodes 112 and the p (or n) type silicon 101 creates a depletion layer extending down to the conversion layer 102a and sideways to the regions between the 3D electrodes 112. The grooves 113 increase the surface area of the neutron conversion layer 102b for higher neutron absorption probability. The dimensions of the grooves 113 and pixel plateaus are preferably chosen so as to produce the largest possible surface area of the conversion layer 102b for a desired thickness of the active region 101. The thickness of the neutron conversion layers 102a and 102b is typically 5 μm. The thickness of the active region, i.e. the first semiconducting element 101 is typically 10-30 μm. The wafer substrate 113 can be of conventional thickness (as in the drawing) or physically thinned, as described elsewhere in this document. The wafer substrate 113 can alternatively be a high resistivity Si wafer without the conversion layer 102a. If a high resistivity Si wafer is used the thickness of the active region of the first semiconducting element can be made small by tuning the depletion voltage appropriately or by doping a p well (n well if the substrate is p type) around the electrodes 112. The 3D electrodes 112 can alternatively be planar processed 2D electrodes, such as depicted in connection with FIGS. 8B-C.

Figure 7A:
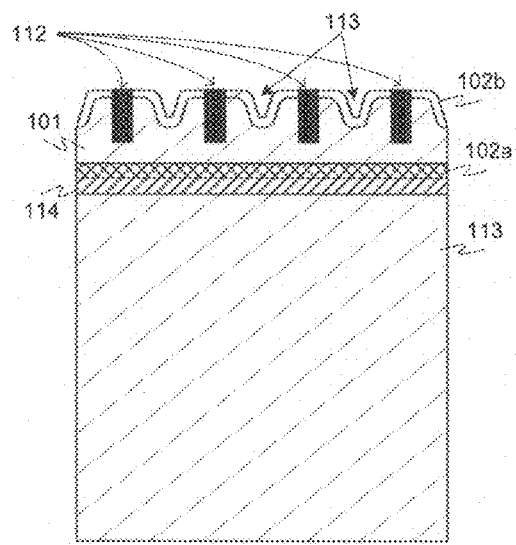
FIGS. 7A-D illustrate an example of an electrically thin structure manufactured by the method described in connection with FIGS. 6A-B according to an advantageous embodiment of the invention.
Figure 7B:
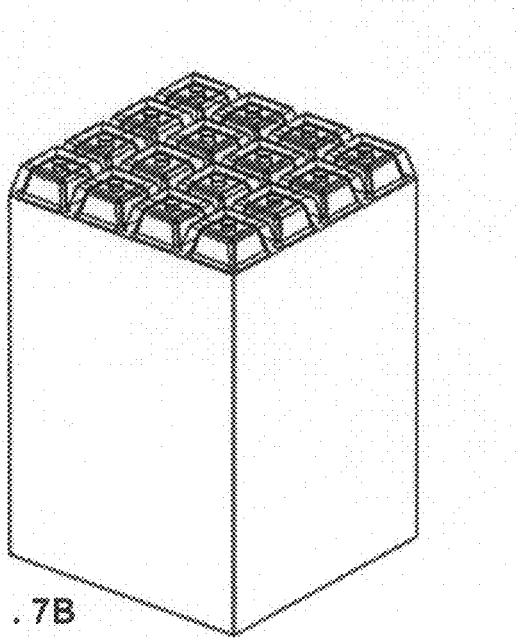
Figure 7C:
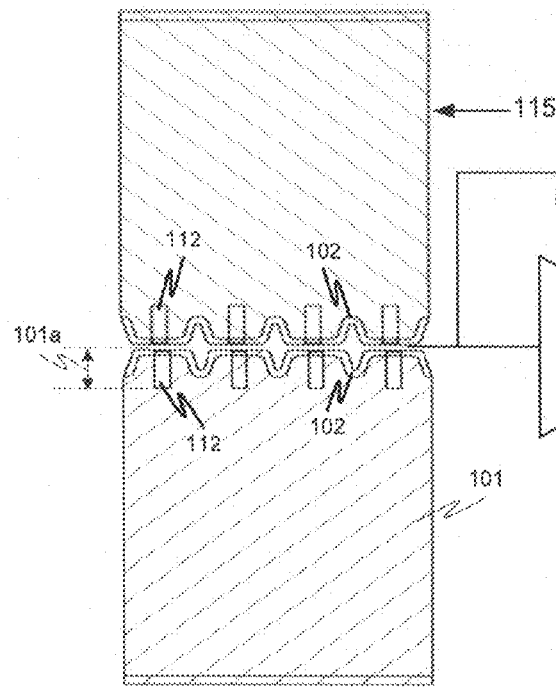
Figure 7D:
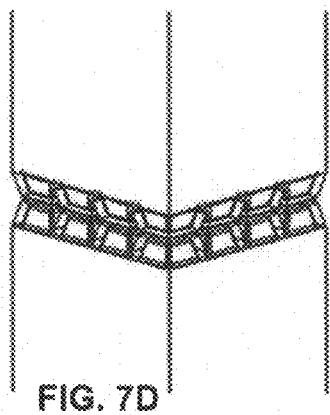

According to an embodiment the pixel electrodes can either be shortened together (e.g. by a sputtered metal layer on top of the pixel electrodes) for single channel readout as is depicted in FIG. 7C or connected to a multi channel readout circuit with bump or wire bonding or similar means as illustrated e.g. in connection with FIG. 13. If the pixels are shortened and the detector is used as a single channel device two detectors can be sandwiched face-to-face for double efficiency, as illustrated in FIGS. 7C and 7D.

It should be noted that the detector may comprise an additional detector element 115 (essentially similar than the lower one), where the detector elements are arranged face-to-face to each other and advantageously so that the neutron converters 102 of the detector elements are faced to each other. Now the read-out means, such as read-out electronics or even conductive wires, can be applied between the detector elements. The embodiment having two detector elements further enhances neutron conversion efficiency.

According to an embodiment the pixel pitch of the detector structure illustrated in FIGS. 7A-D is typically 50 µm or even smaller. The 3D electrodes advantageously extend the depletion layer below the grooves 113. The grooves may be manufactured e.g. by etching. The structure of the detector illustrated in FIGS. 7A-D enables optimum efficiency maintaining thin depletion layer.

According to an embodiment of the invention the converter material to be coupled with the detector material may be planar, such as depicted in FIG. 8A. However, according to another embodiment of the invention, such as depicted in FIGS. 7A-D, 8B-C and 9, at least one of the surfaces of 102a, 102b the converter material has more complex shape, such as 3D, a sawtooh-like or rugged surface in order to maximize the effective surface area of the neutron reactive converter to convert neutron. Such geometries allow a larger volume and/or surface area of the neutron converter while keeping a high probability of the secondary particle detection.

FIGS. 8B-C illustrates examples (side and perspective views) of a thin semiconductor neutron detector with a neutron converter 102 deposited on the surface of the first semiconducting element 101 according to an advantageous embodiment of the invention. Also the electrodes 113 and depletion areas 116 can be seen in FIGS. 8B-C, as well as the 3D structure, which increases the surface area of the neutron converter 102 made of neutron reactive material. According to an embodiment the pixel size is 100-300 µm. The structure may be e.g. bump-bonded for position sensitive detection, but also short-circuited if the purpose of using is e.g. only count detection. Grooves can be manufactured e.g. by dicing or etching. It should be noted that the similar structure may also be applied in other detectors depicted in this document in connection with other figures.

According to an embodiment the converter layer most distant from the detector surface may have a complex shape, such as the sawtooh-like surface. Also the surface coupled with the detector material may have a complex shape, such as the sawtooh-like shape. In addition according to an embodiment of the invention also both surfaces may have a complex shape, like the shape of sawtooth, such as illustrated by FIG. 9. This kind of converter may efficiently convert neutrons even though they do not enter into the detector (converter material) perpendicularly. Again it should be noted that the neutrons to be detected may be arranged to incident either from the front (first through the converter material 102) or back side (first through the semiconducting material 101) of the detector.

FIG. 10 illustrates an exemplary detector according to an advantageous embodiment of the invention, where the neutron reactive material 102 is applied, such as ion-implanted on the surface and/or inside the structure of said first semiconductor element 101. When the neutron reactive material 102 is applied inside the structure, it is still advantageously arranged in the surface layer 101a in the proximity to the charge collecting areas (not shown in FIG. 10) so that the released ionizing radiation reaction products can effectively reach the first semiconductor 101 and that the generated electron-hole pairs can be effectively caught by said charge collecting areas. According to an embodiment the neutron reactive material 102 is advantageously arranged as clusters on and/or in the surface of the first semiconductor element 101 (as in FIG. 10). According to an embodiment of the invention the neutron reactive material 102 can be arranged between the read-out electronics and the first semiconductor element, and/or on the surface of the first semiconductor element. This can be achieved for example by the laser ablation as illustrated elsewhere in this document.

FIG. 11 illustrates an exemplary semiconductor detector with pores 105, such as pillars or other cavities, according to an advantageous embodiment of the invention. The pores 105 may be filled with the neutron reactive material 102 to convert neutrons for detectable reaction products, such as to gamma photons or other products described e.g. in this document. The neutron reactive filling material is advantageously the same as used for neutron converter 102 in other parts of the detector. The cavities may be in perpendicularly in relation to the converter layer coupled with the detector material, but also in some other angle so that the neutrons will interact with the filling material even though they will enter into the detector in other angle than essentially perpendicular. The detector structure having pores or other cavities may also in additionally have more complex shapes for the surfaces as well as comprise also neutron reactive material as clusters on and/or inside the detector structure, advantageously the first semiconductor structure, such as disclosed above in connection with FIGS. 9 and 10, for example (even though it is not shown in FIG. 11 for clarity reasons).

The pores may be manufactured by the known technologies applicable for fabrication of 3D structures (pores) in semiconductor materials. The technologies of pore fabrication are for example reactive ion etching and electrochemical etching. In both cases, the etching may be preceded by a photolithographic step which prepares a mask for the etching. The mask protects areas of surface against the etching and opens top of patterns to be etched. Type of the mask depends on the used technology. It can be a metal for DRIE or $SiO_2$ layer for the electrochemical etching.

In Deep Reactive Ion Etching (DRIE) is a highly anisotropic etch process used in microsystem technology. It is used to create deep and high aspect ratio holes and trenches in silicon and other materials. Structures with aspect ratios 20:1 and more can be produced. DRIE etch rates are 5-10 µm/minute.

Another exemplary method for pore creation is the electrochemical etching (EE), which is a low cost alternative to deep reactive ion etching (DRIE). It allows fabrication of structures such as walls, tubes, pillars and pores. In electrochemical etching the applied electric field may be concentrated e.g. on the inverted pyramid tips (for example when the shape is like sawtooth).

FIG. 12 illustrates an exemplary pixelization 106 of the detector 100 in order to detect both the neutron collision and its location on the detector according to an advantageous embodiment of the invention. The pixelization may be implemented e.g. by dividing at least the portion of the semiconducting element 101 electrically into plurality of areas, hereinafter pixels 106. The electrical dividing can be achieved e.g. by using plurality of electrodes, whereupon the electrical charges generated in the semiconductor element are collected by the nearest electrode. Thus also the location of the generated electrical charge in the semiconducting element 102 can be determined based on the location of the electrode collecting said electrical charge.

The detector with pixelization, as illustrated in FIG. 12, can be used e.g. for neutron imaging according to an embodiment of the invention, where the detector sensitive volume is arranged so that it can both detect the neutron (or the radiation reaction products produced by the collision of the neutron with the neutron reactive material), but also its location on the detector. For example by utilizing the high integration of contemporary electronic parts for the design of an imaging detector can improve parameters of current radiation imaging systems.

However, in order to read the collisions and location the detector of FIG. 12 is advantageously provided in addition with a readout chip 107, as is illustrated in FIG. 13. The detector may be for example flip-chipped or bump-bonded to the readout chip 107, such as e.g. CMOS (Complementary Metal-Oxide-Semiconductor) or the like. The bump-bonding may be implemented via bump-balls 110. According to an embodiment each pixel may advantageously have its own readout with preamplifier, discriminator and 15-bit counter, for example. The readout chip may be manufactured for example according to 1 μm SACMOS (Self-Aligned Contact Metal-Oxide-Semiconductor) technology.

According to another embodiment of the invention the neutron imaging device may also be manufactured using 6-metal 0.25 μm CMOS technology, where the pixel size may be e.g. 55×55 μm$^2$ and the pixel array even 256×256 pixels, for example. The sensitive area may be about 2 cm$^2$. According to an embodiment the readout electronics may offer a possibility to use two discriminators to set an energy window for choosing the measured energy of radiation. Each cell may contain e.g. a 13-bit counter and an 8-bit configuration register which allows masking, test-enabling and 3-bit individual threshold adjust for each discriminator, for example. Using the serial or parallel interface, the readout of the whole matrix containing measured data (clock 100 MHz) may take 9 ms or 266 μs, respectively. The fast readout is predestinating this detector also for applications where a fast frame acquisition is needed. Overall the detector illustrated in FIGS. 12 and 13 provides huge advantages, because they provide a high spatial resolution, high dynamic range and low noise.

The signal created by the heavy charged particles is typically high enough to set the discriminator threshold in each pixel far above the noise and a possible background. Counts of events in each pixel obey a Poisson distribution with a standard deviation determined only by the number of neutrons reacting in the converter. Therefore, the signal to noise ratio can be improved to an arbitrary level only by an exposition time extension. In the case of thermal neutrons the threshold is high and thus the background is neglectable. The signal to noise ratio is then given only by where n is a number of counts per pixel.

FIG. 14 illustrates an exemplary semiconductor detector with an additional second semiconducting element 108 according to an advantageous embodiment of the invention, which may be applied e.g. to neutron spectroscopy or imaging and to detect the kinematic of the reaction of the neutron with the detector. The detector of FIG. 14 comprises neutron converter 102 and ultra thin semiconducting element 101 similarly as discussed earlier in this document, but in additionally the detector comprises also second additional semiconducting element 108. The second semiconducting element 108 is typically much thicker (108a) that the one 101 coupled with the neutron converter material 102 and comprises advantageously cadmium telluride (CdTe). The exemplary thickness of the thicker second semiconducting element 108 may be according to an embodiment of the invention even 5 mm or more.

In some neutron conversion reactions gamma rays or X-rays are created. These gammas should not be detected by the first semiconducting element 101 but should escape or penetrate the first semiconducting element 101 and be detected by a separate detector, such as the second semiconducting element 108.

The advantage of the neutron detector according to FIG. 14 is that for example the gamma rays or X-rays (originated from the collision of neutron to be detected with the neutron reactive material) passing the ultra thin semiconducting element 101 may be detected by the thicker second semiconducting element 108, because the probability for the interaction of the gamma rays or other reaction products with the semiconducting material increases when the thickness of the semiconducting material increases. Thus the kinematic of the detected neutrons, such as e.g. a path of the gamma photons generated by the neutron in the neutron reactive material or reaction place of the neutron in the neutron reactive material, as well as also energy of the incident neutron can be detected. When the kinematic (momentum or energy and direction) of the gamma photon and the energy of the reaction product is determined, the source or origin of said incident neutron can be identified.

In addition the using of the detector of FIG. 14 enables e.g. combined neutron and X-ray spectroscopy or imaging and use of plurality of neutron and X-ray sources, because by the detector of FIG. 14 the origin or source of the gamma or X-ray photon can be determined. I.e. when the gamma or X-ray photon is detected by the second semiconducting element 108 it can be determined whether it was produced by the interaction of the incident neutron with the neutron reactive material or whether it was originated from the gamma or X-ray source outside the detector.

The second semiconducting element 108 also advantageously comprises own pixelization 106, and it should be provided by own readout chip (not shown), which is arranged advantageously in electrical connection with the pixelization 106 of the second semiconducting element.

FIG. 15 illustrates an exemplary neutron detector with electrodes 113, where the electrodes are advantageously e.g. etched into the detector structure for example in the form of cylinder. According to an embodiment of the invention the electrodes 113 may comprise neutron reactive material 112 inside the electrode structure 113. In other words the outer layer of the electrode structure 113 forms an electrode and the inner portion is filled with the neutron reactive material 112. This still increases the surface area of the neutron reactive material and thereby also the probability that the incident neutrons will be converted into the reaction products. In addition when the reaction products fly through the electrode wall, they will advantageously produce electrical charges (such as electron-hole pairs) in the vicinity of the electrode, whereupon the produced charges can be effectively caught by the electrode. Thus the detector illustrated in FIG. 15 is very efficient both for converting the neutrons and collecting the charges.

Figure 16:
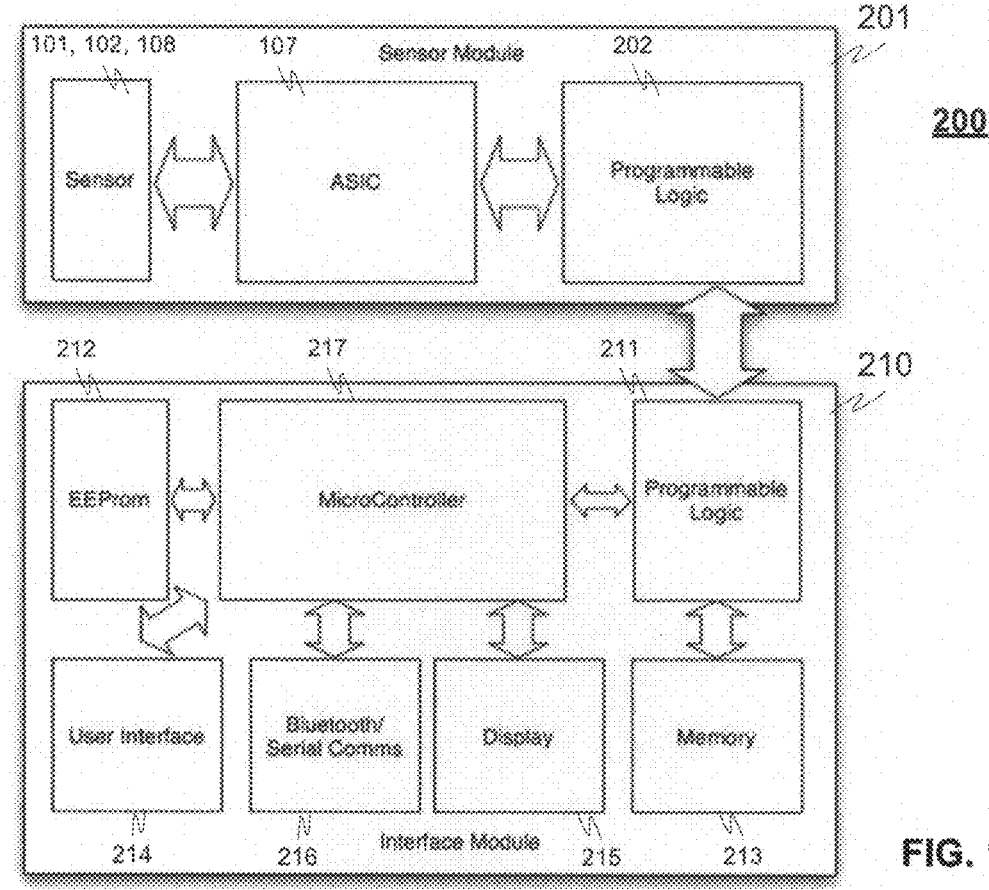
FIG. 16 illustrates an exemplary device for detecting neutrons according to an advantageous embodiment of the invention.

FIG. 16 illustrates an exemplary device 200 for detecting neutrons according to an advantageous embodiment of the invention. The device 200 advantageously comprises a detector module 201 and interface module 210, the detector module having neutron convertor 102, such as depicted elsewhere in this application, as well as at least one semiconducting element 101, 108. The semiconducting element 101, 108 is advantageously electrically coupled with the readout electronics 107, such as e.g. ASIC chip. In addition a programmable logic 202 may be adapted to provide functions of the detector module 201, such as signal processing, timing and control operations, as well as also to provide interface and data communication between the detector module 201 and the interface module 210. The interface module 210 advantageously comprises own programmable logic 211.

In addition the interface module 210 advantageously comprises EEPROM memory means 212, as well as also other memory means 213 for storing data, user interface means 214 for controlling the operation of the device 200, display means 215 for displaying information, such as total counts and/or dose related to counted neutrons or reactions, and data communication means 216, such as wireless communication means, which may be implemented e.g. by Bluetooth or WLAN, for example. The data communication means 216 may also have serial communication bus, such as USB. In addition the interface module 210 advantageously comprises a microcontroller 217 for controlling the operations and the data communications between the portions 211-216 of the interface module.

Figure 17:
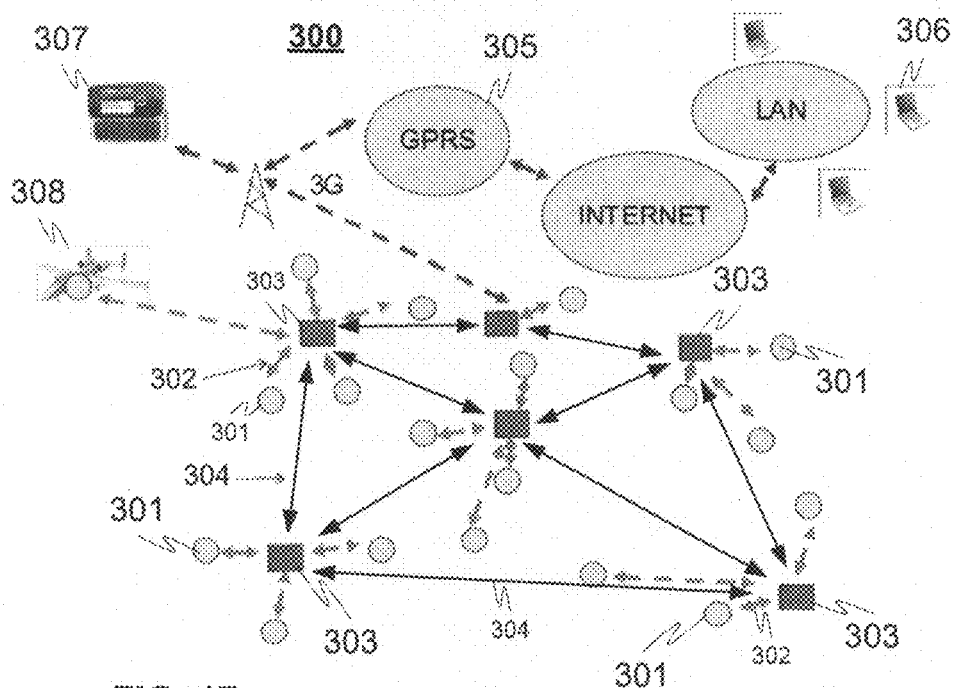
FIG. 17 illustrates an exemplary arrangement utilizing neutron detectors of the invention according to an advantageous embodiment of the invention.

The neutron detectors of the invention have many applications. Due to their compact size, low cost, high detection efficiency, low power consumption as well as direct real time conversion of neutron signal they can be used for example to real time monitoring. One possible arrangement 300 utilizing the neutron detectors of the invention is illustrated in FIG. 17, where the neutron detectors form advantageously a measuring network for communicating measuring information for example from a measurement point e.g. via a base stations or other nodes to a central control point. Due to plurality of the measuring points, which are measuring neutrons in real time, a possible neutron migration can be detected and forecast composed for example in a rescue viewpoint.

The arrangement 300 may advantageously comprises plurality of sensor nodes 301 each of them utilizing at least one neutron detector of the invention. The sensor nodes 301 are advantageously powered e.g. by batteries, solar cell or other way known by the skilled person, and the data communication 302 of the sensor nodes 301 is advantageously implemented in a wireless way, such as utilizing WLAN (802.1 b, g or 6LowPan) or other wireless technology known by the skilled person. Therefore the sensor nodes 301 can be located e.g. geographically in very difficult places. However, it should be noted that sensor nodes 301 can also be mains powered and/or the data communication 302 of the sensor nodes 301 can also be implemented by a wire.

The sensor nodes 301 are advantageously in a data communication with a backbone node 303, such as mains powered backbone WLAN MESH nodes utilizing WLAN (802.1 b, g or 6LowPan) or other data communication technology known by the skilled person. In addition the backbone nodes 303 may be in data communication 304 with each other, as well as e.g. via base stations with operators 305 for example in 3G or GPRS network, internet or the like. According to an embodiment also users, databases and application servers 306 may gather measuring data e.g. via LAN, and mobile users 307 e.g. via mobile network, such as 3G or GPRS. In addition according to an embodiment also e.g. administrators may be in data communication with the measuring nodes or even with the detectors in the nodes (such as controlling the operation of them) via data communication network illustrated in FIG. 17.

In addition the measuring nodes with the detectors may be arranged for example in vehicles, such as airplanes and especially Unmanned Aerial Vehicle 308, the operation of which can be programmed beforehand but also the operation of which can be controlled via the data communication network illustrated in FIG. 17.

The neutron detectors of the invention have also other application areas in addition to safety and monitoring of background radiation, such as security (protection against nuclear terrorism) and imaging, as well as non-destructive tests (neutron imaging for industrial applications, complementary to X-rays). In addition the detectors may be used for health purposes, such as personal dosimetry for e.g. personnel exposure at nuclear power plants and soldiers on a field.

The present invention offers clear advantages, such as low cost, high detection efficiency, direct real time conversion of neutron signal, compact size, low power consumption, well suitability for high volume production, good discrimination power against background X-rays and/or γ-rays, and suitability for neutron imaging. In addition the neutron spectroscopy is also possible according to embodiments of the invention as depicted above in this document. The invention also offers flexible modular architectures, based on a variety of detector substrates and readout ASICs, for example.

As a conclusion the converter materials of the invention advantageously have high Z, such as CdTe or CdZnTe converters have a high Z and hence they are well suitable for example for converting neutrons for example into detectable gamma rays. For example the natural Cd contains also $^{113}$Cd which has a high cross section for thermal neutron capture. Products of this reaction are gamma photons and conversion electrons. When a neutron is captured for example by a Cd nucleus, a 558 keV photon is emitted and about 3% of photons are converted to electrons of the same energy by the internal conversion mechanism.

The detection efficiency can be increased by introduction of 3D and/or more complex structures into the semiconductor detector and converter material, even if the semiconductor element and/or converting material is ultra thin. The detection efficiency can be increased from less than 5% in the case of the planar devices to more than 30% in the case of the 3D detectors The invention has been explained above with reference to the aforementioned embodiments, and several advantages of the invention have been demonstrated. It is clear that the invention is not only restricted to these embodiments, but comprises all possible embodiments within the spirit and scope of the inventive thought and the following patent claims. For example the presented detectors are being developed especially for neutron detecting, counting and imaging, but can find usage also in other scientific and technical applications.

In addition, even though electrodes for collecting the charges are not described in further details, they may be arranged according to an embodiment of the invention as planar on the surface of the detector (i.e. perpendicularly to the neutron flux). However, also an embodiment where the electrodes are arranged in other way, such as essentially parallel with the neutron flux (e.g. as disclosed in the publication of WO 2009/071587), can be used for collecting the charges produced.

Furthermore it should be noted that read-out means connected to the electrodes may be implemented e.g. by an electrically conductive wire and the separate read-out electronics may be arranged elsewhere than on the surface of the detector or in direct contact with the electrodes. According to an embodiment the read-out electronics may be connected to the electrodes via wires, and/or a conductive means, such as wire or metal plate, may be used to short-circuit the electrodes of the detector, for example when only the counts are detected and the location information is not needed.

The invention claimed is:

1. A detector for detecting neutrons, wherein the detector comprises:
   a neutron reactive material adapted to interact with neutrons to be detected and release ionizing radiation reaction products in relation to said interactions with neutrons,
   a first semiconductor element, said first semiconductor element being coupled with said neutron reactive material and adapted to interact with said ionizing radiation reaction products and provide electrical charges proportional to the energy of said ionizing radiation reaction products,
   electrodes arranged in connection with said first semiconductor element for providing charge collecting areas for collecting the electrical charges and to provide electrically readable signal proportional to said collected electrical charges
   wherein
   the thickness of the first semiconductor element is adapted to be electrically and/or physically so thin that it is essentially/practically transparent for incident photons.

2. A detector of claim 1, wherein the neutron reactive material forms a neutron sensitive converter the thickness of which is adapted to be physically so thin that it is essentially/practically transparent for incident photons.

3. A detector of claim 1, wherein the first semiconductor element comprises pores which are filled with the neutron reactive material and/or neutron reactive material on and/or inside the structure of said first semiconductor.

4. A detector of claim 1, wherein the neutron reactive material is arranged between the first semiconductor element and the read-out electronics electrically coupled with said first semiconductor element, on the same surface of said first semiconductor element than the electrodes, within said electrode structures and/or on the surface of said read-out electronics.

5. A detector of claim 1, wherein the neutron reactive material comprises at least one of the following: $^{10}B$, $^{6}Li$, $^{3}He$, $^{155}Gd$, $^{157}Gd$, $^{113}Cd$, cadmium telluride (CdTe), cadmium zinc telluride (CdZnTe), or composite materials based on boron nitride (BN) or lithium fluoride (LiF).

6. A detector of claim 1, wherein
   the neutron reactive material forms a neutron sensitive converter at least one surface of which is complex and/or comprises grooves and/or pores,
   the neutron reactive material is arranged advantageously as clusters:
      on and/or in the surface of the first semiconductor element, and/or
      between the read-out electronics and the first semiconductor element.

7. A detector of claim 1, wherein the detector comprises in addition a second semiconductor element, which is thicker than the first semiconductor element coupled with the neutron reactive material so that the second semiconductor element is sensitive for the gamma photons generated by the neutrons when interacting with said neutron reactive material, and wherein the second semiconductor element is adapted to provide electrical charges proportional to energy of said gamma photons.

8. A detector of claim 7, wherein the detector is coupled with a coincidence means for providing a time window during which the detector is adapted to detect the gamma photon, and where the starting point of the time window is triggered by the interaction of the neutron with the neutron reactive material generating said gamma photon.

9. A detector of claim 1, wherein the first and/or second semiconductor element is electrically divided into plurality of areas by plurality of electrodes so that the electrical charges generated in the corresponding semiconductor element is adapted to be collected by the nearest electrode, whereupon the location of the generated electrical charge is determined based on the location of the electrode collecting said electrical charge.

10. A detector of claim 1, wherein read-out electronics is coupled with the electrodes of the first and/or second semiconductor element to detect the charges collected by the electrodes and where the read-out electronics are adapted to generate electric signals proportional to the collected charges.

11. A neutron detecting device for detecting neutrons, wherein the detector comprises:
   a neutron reactive material adapted to interact with neutrons to be detected and release ionizing radiation reaction products in relation to said interactions with neutrons,
   a first semiconductor element, said first semiconductor element being coupled with said neutron reactive material and adapted to interact with said ionizing radiation reaction products and provide electrical charges proportional to the energy of said ionizing radiation reaction products,
   electrodes arranged in connection with said first semiconductor element for providing charge collecting areas for collecting the electrical charges and to provide electrically readable signal proportional to said collected electrical charges,
   and wherein
   the thickness of the first semiconductor element is adapted to be electrically and/or physically so thin that it is essentially/practically transparent for incident photons,
   and wherein the neutron detecting device further comprises user interface means for controlling the operation of the device, memory means for storing and a display means for displaying information related to said detected neutrons.

12. An arrangement for detecting neutrons, wherein the arrangement comprises at least one detector, and wherein the detector comprises:
   a neutron reactive material adapted to interact with neutrons to be detected and release ionizing radiation reaction products in relation to said interactions with neutrons,
   a first semiconductor element, said first semiconductor element being coupled with said neutron reactive material and adapted to interact with said ionizing radiation reaction products and provide electrical charges proportional to the energy of said ionizing radiation reaction products,
   electrodes arranged in connection with said first semiconductor element for providing charge collecting areas for collecting the electrical charges and to provide electrically readable signal proportional to said collected electrical charges, and wherein the thickness of the first semiconductor element is adapted to be electrically and/or physically so thin that it is essentially/practically transparent for incident photons, and wherein the detector is in addition coupled with a data transmission means for transmitting information measured by said detector via a data communications network to a data receiving means of the arrangement.

13. An arrangement of claim 12, wherein the data transmission means of the detector is wireless data transmission means and wherein at least one detector is arranged into a moving vehicle.

14. An arrangement of claim 12, wherein also geographical location information (GPS) of the detector transmitting data related to the detected neutrons is provided to the data receiving means of the arrangement.

15. Neutron imaging apparatus for providing a tomographic image of an object to be imaged, wherein the apparatus comprises at least one detector for detecting neutrons penetrating through the object and wherein the detector comprises:

a neutron reactive material adapted to interact with neutrons to be detected and release ionizing radiation reaction products in relation to said interactions with neutrons, a first semiconductor element, said first semiconductor element being coupled with said neutron reactive material and adapted to interact with said ionizing radiation reaction products and provide electrical charges proportional to the energy of said ionizing radiation reaction products, electrodes arranged in connection with said first semiconductor element for providing charge collecting areas for collecting the electrical charges and to provide electrically readable signal proportional to said collected electrical charges, and wherein the thickness of the first semiconductor element is adapted to be electrically and/or physically so thin that it is essentially/practically transparent for incident photons, and wherein the neutron imaging apparatus further comprises image constructing means for constructing said tomographic image using the measuring information related to said neutrons detected by said detector.

16. A method of manufacturing the detector, wherein the detector comprises:

a neutron reactive material adapted to interact with neutrons to be detected and release ionizing radiation reaction products in relation to said interactions with neutrons, a first semiconductor element, said first semiconductor element being coupled with said neutron reactive material and adapted to interact with said ionizing radiation reaction products and provide electrical charges proportional to the energy of said ionizing radiation reaction products, electrodes arranged in connection with said first semiconductor element for providing charge collecting areas for collecting the electrical charges and to provide electrically readable signal proportional to said collected electrical charges, and wherein the thickness of the first semiconductor element is adapted to be electrically and/or physically so thin that it is essentially/practically transparent for incident photons, and wherein the method the neutron reactive material is arranged on and/or inside the first semiconductor element by applying a surface deposition method.

* * * * *